(12) United States Patent
Doris et al.

(10) Patent No.: US 6,914,303 B2
(45) Date of Patent: Jul. 5, 2005

(54) ULTRA THIN CHANNEL MOSFET

(75) Inventors: Bruce B. Doris, Brewster, NY (US); Thomas S. Kanarsky, Hopewell Junction, NY (US); Ying Zhang, Yorktown Heights, NY (US); Huilong Zhu, Poughkeepsie, NY (US); Meikei Ieong, Wappingers Falls, NY (US); Omer Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/650,229

(22) Filed: Aug. 28, 2003

(65) Prior Publication Data
US 2005/0048752 A1 Mar. 3, 2005

(51) Int. Cl.[7] .............................. H01L 27/01
(52) U.S. Cl. ....................... 257/350; 257/347
(58) Field of Search ................. 257/204, 347, 257/350

(56) References Cited
U.S. PATENT DOCUMENTS 6,287,924 B1 * 9/2001 Chao et al. ............... 438/300
6,329,704 B1   12/2001 Akatsu et al.
6,501,134 B1 * 12/2002 Krivokapic ............... 257/350
6,812,105 B1 * 11/2004 Dokumaci et al. ........ 438/300

* cited by examiner

Primary Examiner—David Nelms
Assistant Examiner—Quoc Hoang
(74) Attorney, Agent, or Firm—Scully, Scott, Murphy & Presser; Robert M. Trepp, Esq.

(57) ABSTRACT

Described is a method for making thin channel silicon-on-insulator structures. The inventive method comprises forming a set of thin spacer abutting a gate region in a first device and a second device region; forming a raised source/drain region on either side of the gate region in the first device region and the second device region, implanting dopants of a first conductivity type into the raised source drain region in the first device region to form a first dopant impurity region, where the second device region is protected by a second device region block mask; implanting dopants of a second conductivity type into the raised source/drain region in the second device region to form a second dopant impurity region, where the first device region is protected by a first device region block mask; and activating the first dopant impurity region and the second dopant impurity region to provide a thin channel MOSFET.

4 Claims, 4 Drawing Sheets

ULTRA THIN CHANNEL MOSFET

FIELD OF INVENTION

The present invention relates generally to semiconductor integrated circuits. More particularly, the present invention relates to a method of forming thin channel MOSFETs having raised source/drain regions formed prior to the extension regions.

BACKGROUND OF THE INVENTION

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device.

Thin channel silicon-on-insulator (SOI) devices are a promising option to further continue SOI complementary metal oxide semiconducting (CMOS) device scaling. Ultra-thin silicon channel devices provide a sharper sub-threshold slope (measure of the abruptness of the switching of the device), higher mobility, and better short channel effect control than silicon-on-insulator devices having a conventional thick channel.

A disadvantage of thin silicon channel devices is that as the SOI film is thinned the series resistance increases. One solution to the increasing series resistance inherent in thin channel devices is the use of elevated source/drain regions that may be formed by selective epitaxial silicon growth.

In prior thin channel devices, the extension implants are implanted prior to the formation of the raised source/drain regions; creating at least the following problems. By implanting the thin silicon layer using a high dose and high-energy implant, the silicon crystal layer can be amorphized. Additionally, during activation of the source/drain regions, the anneal processing step causes re-crystallization of the amorphous layer, which can result in the formation of polysilicon and the introduction of defects to the thin channel region resulting in a high resistivity. In addition, it is also difficult to clean the surfaces when P-type regions are formed due to electrochemical reactions since the P-type material has a greater affinity for oxide material and thus requires intensive surface preparation. The epitaxial growth process requires a clean surface having a crystalline structure. Therefore, it is highly desirable to provide a device that overcomes the above limitations.

Moreover, prior art thin ultra-small gate-length devices require an offset spacer for the formation of P-FET extension regions resulting in a high resistance region formed beneath the spacer. The silicon region directly outside the channel is thinner than the channel thickness underlying the gate stack due to over-etching during gate stack processing. When the offset spacer is deposited over the thin silicon region, a high resistance region is formed which limits device performance. The spacer dimension is directly related to resistance. Larger spacers cause higher resistance. Furthermore, since the extension implants are formed prior to the raised source/drain regions, they are subjected to the significant thermal budget of the raised source/drain process, which results in the unwanted diffusion of the dopant species. Typical raised source/drain process temperature is about 850° C., which is enough to cause significant diffusion. Another problem with the raised source/drain process is that the high temperature causes dopant loss since the Si surface is not protected during the growth process. Dopant loss also contributes to high resistance since the dopant is needed to make the semiconductor conductive. Adding a greater dose of the dopant species to compensate for the dopant loss further aggravates the diffusion problem since a greater dose of the dopant species is well known to cause greater diffusion of the dopants.

Additionally, the surfaces of P-type doped regions and N-type doped regions have different epitaxial growth rates, because the incubation time for epitaxial growth of raised source/drains on P-type doped regions differs from the incubation time for the epitaxial growth of raised source/drains on N-type doped regions. The difference in epitaxial growth rate can result in a substantially different raised source/drain thickness for the P-type and N-type regions, when processing both regions using the same incubation time. Finally, the surface concentration of the dopants must be uniform across the wafer as well as from wafer to wafer, which is a major challenge for manufacturing.

In one prior art thin channel device, a wide disposable spacer is utilized to grow the raised source/drain regions. High-energy implants are then performed to form deep source/drain regions. Following the source/drain implant, the wide disposable spacer is removed and the extension regions are implanted. The above prior art process overcomes excessive extension diffusion and the epitaxial Si growth rate differential between P-type and N-type regions, but does not overcome the formation of high resistance regions outside the raised source/drain area which are key to the performance of ultra-thin SOI MOSFETs. The formation of high resistance regions outside the raised source/drain area is also cost ineffective.

It would be highly desirable to provide a thin channel CMOS device that overcomes the above described high resistance region and exposure to high thermal budgets during processing.

SUMMARY

It is an objective of the present invention to provide a method for fabricating a thin channel silicon-on-insulator device, and the device therefrom, which avoids the deficiencies of the prior art. More specifically, the present invention overcomes the formation of high resistance regions and the exposure of implant dopants to the thermal budget of the raised source/drain growth process. The present invention obviates the deficiencies of the prior art by using thin spacers to reduce the series resistance of both NFET and PFET devices and by producing the raised source/drain regions prior to dopant implant. Therefore, the present invention improves the uniformity and reproducibility of the selective epitaxial process. The present invention also provides independent offset for NFET and PFET devices, achieving optimal performance for both regions while minimizing external resistance.

In broad terms, the inventive method for forming a thin channel silicon-on-insulator device comprises the steps of:
  providing a structure having at least a first device region and a second device region, each device region comprising at least one gate region located on an SOI layer, said at least one gate region having exposed sidewalls;

forming a set of thin spacers on the exposed sidewalls of each gate region;

forming raised source/drain regions on the SOI layer adjacent to each gate region;

blocking the second device region with a block mask and implanting dopants of a first conductivity type into the raised source/drain regions in the first device region to form a first dopant impurity region;

removing the block mask from the second device region;

blocking the first device region with another block mask and implanting dopants of a second conductivity type into the raised source/drain region in the second device region to form a second dopant impurity;

removing the another block mask; and activating the first dopant impurity region and the second dopant impurity region to provide a thin channel MOSFET.

Another aspect of the present invention, is a thin channel MOSFET produced by the above described inventive method. In broad terms, the thin channel silicon-on-insulator device comprises:

a substrate having at least a semiconducting material atop an insulating layer;

a gate region located on said layer of semiconducting material;

a set of thin spacers abutting the gate region having a first spacer width;

a raised source/drain region on either side of said channel and atop the layer of semiconducting material, wherein the raised source/drain region are separated from the gate region by the set of thin spacers; and a set of independent offset spacers for pFET and nFET extension implants and source drain implants having a offset spacer width atop the raised source/drain region and adjacent the set of thin spacers, wherein the offset spacer width is greater than the thin spacer width.

DETAILED DESCRIPTION

Figure 1:
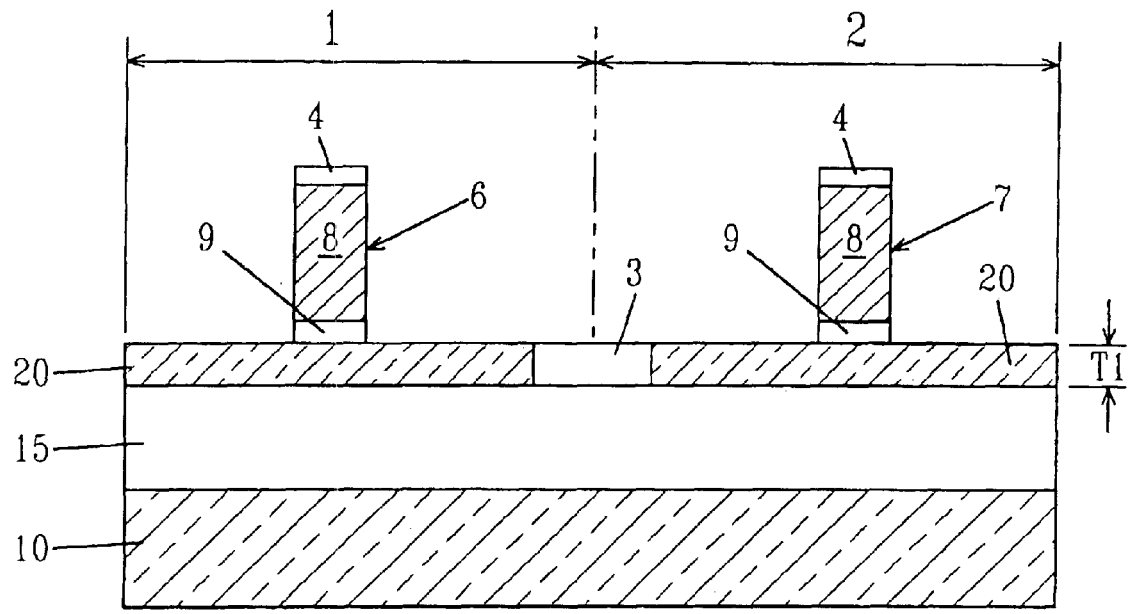
FIG. 1 is a pictorial representations (through a cross sectional view) of the initial stack of the present invention further including gate regions in a first and second device region.

The present invention provides a method for fabricating thin channel silicon-on-insulating (SOI) devices having raised source/drain regions and a low external resistance. Thin channel SOI devices have a channel with a thickness T1 of less than about 200 Å, preferably less than about 150 Å. The present invention also provides a method for forming thin channel SOI devices having raised source/drain regions without subjecting implanted dopant regions to the thermal budget of raised source/drain processing. The present invention will now be discussed in greater detail referring to the drawings accompanying the present application. In the accompanying drawings, like and/or corresponding elements are referred to by like reference numbers.

FIG. 1 illustrates the results of the initial processing steps of the present invention that produce the initial structure 5. Initial structure 5 comprises at least a substrate 10 having a thin layer of semiconductor on insulator (SOI) layer 20 atop an insulating layer 15.

The SOI layer 20 may be a Si-containing layer formed using conventional semiconductor processing techniques, which are well known to those skilled in the art. Alternatively, the SOI layer 20 may comprise any semiconducting material including, but not limited to: Si, strained Si, SiC, SiGe, SiGeC, Si alloys, Ge, Ge alloys, GaAs, InAs, and InP, or any combination of substrates or crystal orientations of the above mentioned substrates. The SOI layer 20 may be thinned to a desired thickness by planarization, grinding, wet etch, dry etch or any combination thereof. A preferred method of thinning the SOI substrate is to oxidize the Si by a thermal dry or wet oxidation process, and then wet etch the oxide layer using a hydrofluoric acid mixture. This process can be repeated to achieve the desired thickness. The SOI layer 20 preferably has a thickness T1 of less than about 200 Å, more preferably less than about 150 Å.

The substrate 10 may be a semiconducting material. The term "semiconductor" as used herein denotes any semiconducting material including, but not limited to: Si, strained Si, SiC, SiGe, SiGeC, Si alloys, Ge, Ge alloys, GaAs, InAs, InP as well as other III/V and II/VI compound semiconductors.

The insulating layer 15 is formed underlying the SOI layer 20 and atop the substrate 10. The insulating layer 15 may be formed by implanting a high-energy dopant into the substrate 10 and then annealing the structure to form a buried oxide layer below the surface of the initial structure 5. Alternatively, the insulating layer 15 may be deposited or grown prior to the formation of the SOI layer 20. Alternatively, the initial structure 5 may be formed using wafer-bonding techniques, where a bonded wafer pair is formed utilizing glue, adhesive polymer, or direct bonding.

Still referring to FIG. 1, the initial structure 10 further comprises a first device region 1 and a second device region 2 separated by an isolation region 3, where a first gate region 6 is positioned atop the first device region 1 of the initial structure 5 and a second gate region 7 is positioned atop the second device region 2 of the initial structure 5. First device region 1 may also be referred to as an N-type device region or P-type device region, while second region 2 is also referred to as the P-type device region or N-type device region. The isolation region 3 separates the device regions 1, 2 of the SOI layer 20 and makes connection or extends into insulating layer 15. Etching the SOI layer 20 and depositing insulative material within the etched portion of the SOI layer 20 may form the isolation region 3. The isolation region 3 is preferably the same material as the insulative layer 15.

The gate regions 6,7 are formed using conventional photolithography and a selective etching process.

Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions.

In a preferred embodiment, a hard mask 4 may be used to form the gate regions 6,7. The hardmask 4 is formed by first depositing a dielectric hard mask material, like SiN or $SiO_2$, atop a layer of gate electrode material and then applying a photoresist pattern to the hardmask material using conventional lithography process steps. The photoresist pattern is then transferred into the hard mask material using a dry etch process forming the hard mask 4. Next the photoresist pattern is removed and the hard mask pattern is then transferred into the gate electrode material during a selective etching process. The hard mask 4 remains atop the gate regions 6, 7 during the epitaxial Si growth process used to form the raised source/drain 21 and prevents the formation of epitaxial Si atop the gate regions 6,7. The hard mask 4 thereby allows for more flexibility in the extension implantation process. The hard mask may be removed by a wet or dry etch prior to the silicidation process.

The gate regions 6,7 each comprise at least a gate conductor 8 atop a gate dielectric 9. Gate conductor 8 material is preferably polysilicon, but may also be comprised of elemental metals, metal alloys, metal silicides, or other conductive materials. Gate dielectric 9 may be a conventional dielectric material such as $SiO_2$, or alternatively high-k dielectrics such as oxides of Ta, Zr, Al or combinations thereof. In a highly preferred embodiment of the present invention, gate dielectric 9 is comprised of an oxide such as $SiO_2$, $ZrO_2$, $Ta_2O_5$ or $Al_2O_3$. Typically, the gate dielectric 9 material has a thickness of from about 1 nm to about 10 nm, with a thickness of from about 1.5 nm to about 2.5 nm being more highly preferred.

Figure 2:
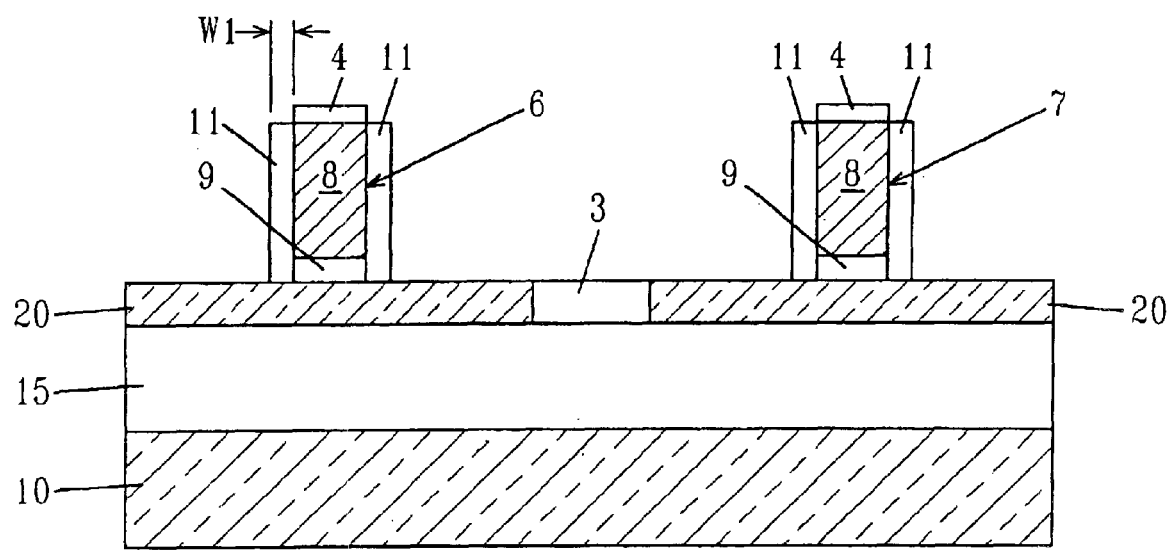
FIG. 2 is a pictorial representation (through a cross sectional view) of the structure of FIG. 1 further including the formation of thin spacers.

Referring to FIG. 2, a set of thin spacers 11 are formed abutting the sidewall of the gate region 6 and gate region 7. The thin spacers 11 prevent the raised source/drain regions 21 of the device from bridging to the gate conductor 8. The thin spacer 11 is narrow having a width W1 ranging from about 2.0 nm to about 15.0 nm. Thin spacer 11 may be formed using conventional deposition and etch processing steps that are well known within the skill of the art. Thin spacer 11 may comprise a dielectric such as a nitride, oxide, oxynitride, or a combination thereof.

The thickness of the thin spacer 11 determines the proximity of the raised source/drain (RSD) regions 21 to the channel of the device. The thin spacer 11 prevents source/drain/gate shorts by separating the gate regions 6,7 from the raised source/drain regions 21 by a dimension equal to the thickness of the thin spacer 11; therefore ensuring that the raised source/drain regions 21 do not contact the gate regions 6,7 of the device.

Figure 3:
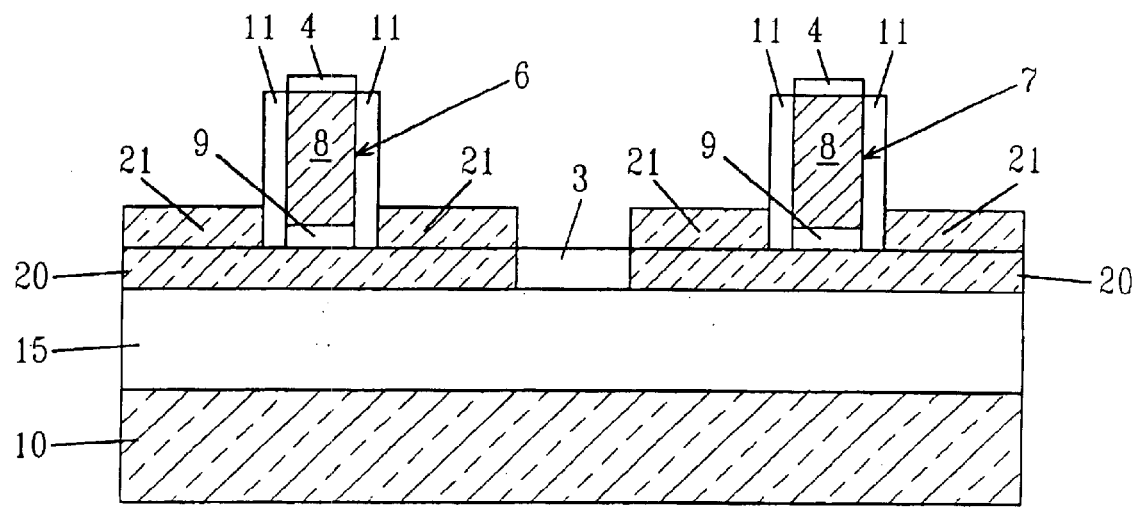
FIG. 3 is a pictorial representation (through a cross sectional view) of the structure of FIG. 2 further including the formation of raised source/drain regions.

Following the formation of the thin spacer 11, the raised source/drain (RSD) regions 21 are formed by selective-epitaxial growth of Si atop the SOI layer 20, as depicted in FIG. 3. Epitaxial, refers to the single crystalline structure of the film. When the chemical reactants are controlled and the system parameters set correctly, the depositing atoms arrive at the wafer surface with sufficient energy to move around on the surface and orient themselves to the crystal arrangement of the wafer atoms. Thus an epitaxial film deposited on a <111> wafer will take on a <111> orientation. If, on the other hand, the wafer surface has an amorphous surface layer, possibly the result of implanting, the depositing atoms have no surface to align to, resulting in the formation of polysilicon instead of single crystal silicon.

A number of different sources may be used for the deposition of epitaxial silicon. Silicon tetrachloride is a preferred source of silicon for epitaxial deposition. Silicon tetrachloride reacts with a Si surface in the following manner:

$$SiCl_4 + 2H_2 \leftarrow \rightarrow Si + 4HCl$$

The temperature for epitaxial silicon deposition typically ranges from about 750° C. to about 900° C. Although higher temperature typically results in faster deposition, the faster deposition may result in crystal defects and film cracking.

Another epitaxial Si source is silane ($SiH_4$). The silane epitaxial growth reaction is as follows:

$$SiH_4 + HEAT \rightarrow Si + 2H_2$$

Dichlorosilane ($SiH_2Cl_2$) may also be used as the epitaxial Si source. Dichlorosilane is also a low temperature source. The dichlorosilane epitaxial growth reaction is as follows:

$$SiH_2CL_2 \leftarrow \rightarrow Si + 2HCl$$

As is well known to one of ordinary skill in the art, adding HCl to the dichlorolsilane gas is an effective means of increasing the selectivity of the Si growth so that the Si only grows on the Si and does not cause shorting or electrical connections between the source/drain regions 21 and gate electrodes 8.

The raised source/drain regions 21 of the present invention are formed prior to implant process steps. Therefore, the raised source/drain regions 21 are deposited atop an intrinsic Si surface. In addition to avoiding forming an amorphous SOI layer 20, the present invention forms the raised source/drain regions 21 atop a clean surface without requiring a cleaning process step.

Additionally, since the implanted dopant regions are formed following the processing of the raised source/drain regions 21, the implanted dopant regions are not subjected to the high temperature thermal budget of the raised source/drain 21 process.

Still referring to FIG. 3, the low resistance epitaxial Si is formed atop the exposed intrinsic Si region, including atop the gate conductor 6,7, assuming it is formed of a Si type material. Epitaxial Si is not formed atop the thin spacer 11 including the region of thin layer SOI underlying the thin spacer 11. Therefore, the thin spacer 11 thickness is minimized to reduce the external resistance of the device.

Figure 4:
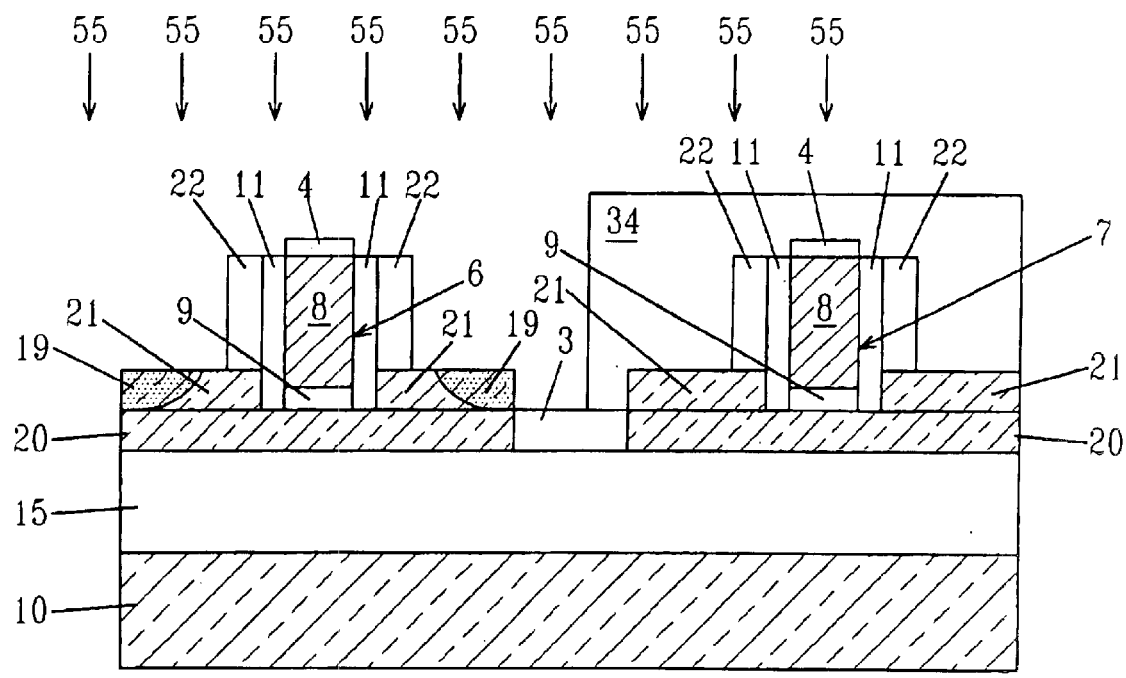
FIG. 4 is a pictorial representation (through a cross sectional view) of the structure of FIG. 3, further including the formation of a set of offset spacers and a block mask atop the second device region prior to the first device region implant.

Referring to FIG. 4, following the formation of the raised source/drain regions 21, a first offset spacer 22 may be formed to offset the first device region 1 dopant implant from the gate 8 edge. The first offset spacers 22 may be formed by depositing a conformal dielectric film and using a highly directional dry etch process. First offset spacer 22 may comprise a dielectric such as a nitride, oxide, oxynitride, or a combination thereof.

The thickness of the first offset spacer is from about 2 nm to about 15 mm. The number of spacers and the thickness of the spacers are selected in response to the implant species for the source/drain regions 21 and the rate at which the implant diffuses through the device structure.

The first device region 1 may be implanted to form an NFET or PFET device. NFET's typically utilize arsenic as an implant species. Therefore, first offset spacers 22 may be incorporated to compensate for the diffusion rate of arsenic and to ensure that arsenic does not diffuse into the channel region of the device. P-FET devices are typically formed using an element from Group III of the periodic table of elements.

In a next process step, a device region block mask 34 is formed atop the second device region 2 by conventional photolithography steps. More specifically, a layer of photoresist material is first deposited atop the initial structure 5. The photoresist material comprises of dielectrics including carbon, oxygen, and various inorganic materials.

Still referring to FIG. 4, following the formation of the device region bock mask 34, an implant 55 is conducted to form first dopant impurity regions 19 in first device region 1 of the device. First dopant impurity regions 19 are produced within the Si-containing raised source/drain regions 21 by doping the raised source/drain regions 21 with group V elements. Although the implant energy and implant dosage is specific to the dopant selected a typical implant energy ranges from about 0.2 keV to about 30 keV and a typically the implant dose ranges from about $3\times10^{13}$ atoms/cm$^2$ to about $7\times10^{15}$ atoms/cm$^2$. In a preferred embodiment, the first dopant impurity regions 19 are doped with arsenic using an implant angle of about 7 to 45 degrees; an energy of about 1.0 keV to about 7.0 keV; and a dose of about $3\times10^{14}$ atoms/cm$^2$ to about $3\times10^{15}$ atoms/cm$^2$. The first dopant impurity regions 19 may be extension regions, halo regions, or deep source/drain regions. Halo regions 58 may be located underneath and laterally adjacent to the extensions in the channel region 59, see FIG. 7.

The second device region 2 of the device is protected by the second device region block mask 34 during the formation of the first dopant impurity regions 19. Following the formation of first dopant impurity regions 19, the device region block mask 34 is stripped from the surface of the device region 2 using a wet chemical process.

Figure 5:
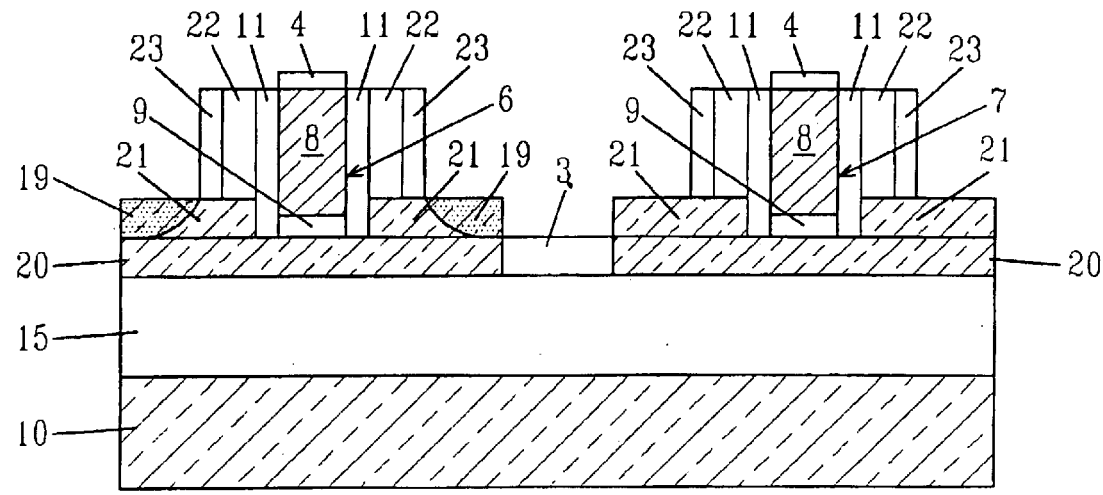
FIG. 5 is a pictorial representation (through a cross sectional view) of the structure shown in FIG. 4 after the removal of the block mask atop the second device region, further including the formation of a third set of spacers.

Referring to FIG. 5, second offset spacers 23 are formed adjacent to the first offset spacers 22 using conventional deposition and etch process steps well known within the skill of the art. The second offset spacers 23 act as an independent adjustment to compensate for second device region 2 processing. The second dopant impurity regions 18 are preferably formed utilizing boron as an implant species. Boron has a higher diffusivity than arsenic, which typically forms the first dopant impurity regions 19. Therefore, the second offset spacers 23 may be incorporated to compensate for the difference in diffusion rates between the implant species in the second dopant impurity regions 18 and first dopant impurity regions 19.

Figure 6:
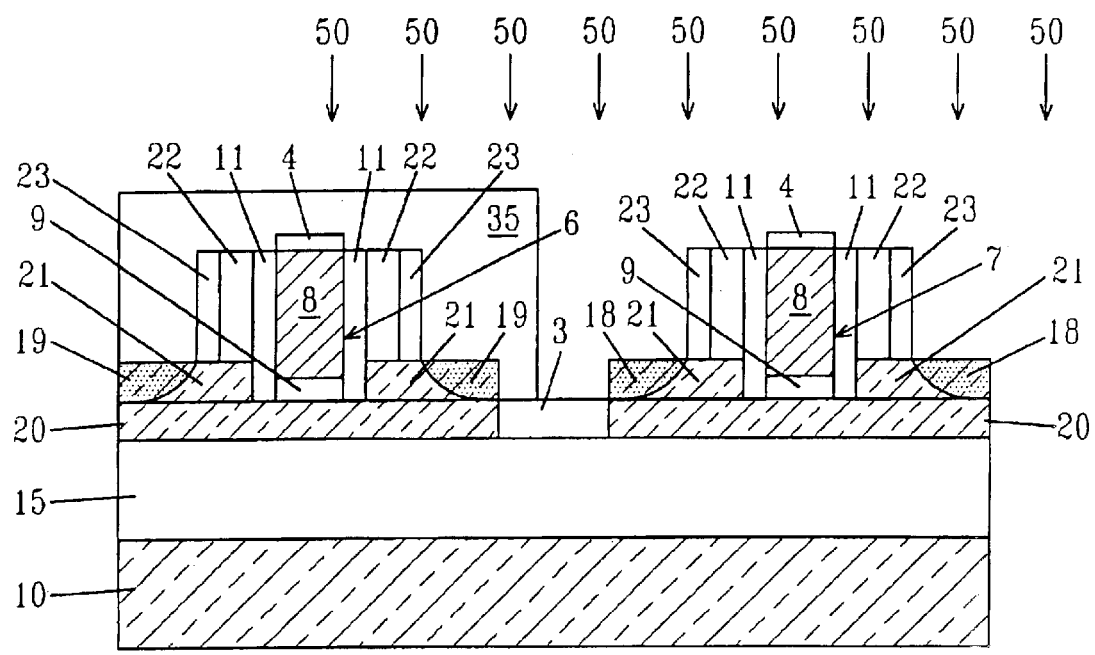
FIG. 6 is a pictorial representation (through a cross sectional view) of the structure shown in FIG. 5, further including the formation of a set of offset spacers and a block mask atop the first device region prior to second device region implant.

A second conformal layer of photoresist is then deposited and patterned to form another device region block mask 35, as depicted in FIG. 6. Block mask 35 is formed in a similar manner to block mask 34 described above. Following the formation of the first device region block mask 35, PFET dopant impurity regions 18 are formed by doping 50 the raised source/drain regions 21 in the second device region 2 of the device by implant.

The second device region 2 may be implanted to form a PFET or NFET device. PFET devices are produced within Si-containing materials by doping with group III-A elements. NFET devices are produced within Si-containing substrates by doping the substrate with group V elements. In a preferred embodiment, the second dopant impurity regions 18 are formed by implanting boron into the raised source/drain regions 21 The boron is implanted using an angle of 7 to 45 degrees, with an energy of about 0.2 keV to about 7.0 keV with a dose of about $5\times10^{13}$ atoms/cm$^2$ to about $3\times10^{15}$ atoms/cm$^2$. The second dopant impurity regions 18 may be extension regions, halo regions, or deep source/drain regions. Halo regions 58 may be located underneath and laterally adjacent to the extensions in the channel region 59.

During the formation of the second dopant impurity regions 18, the second device region is protected from further implant by block mask 35. Following the formation of the second dopant impurity regions 18, the block mask 35 is stripped using a wet chemical process.

Figure 7:
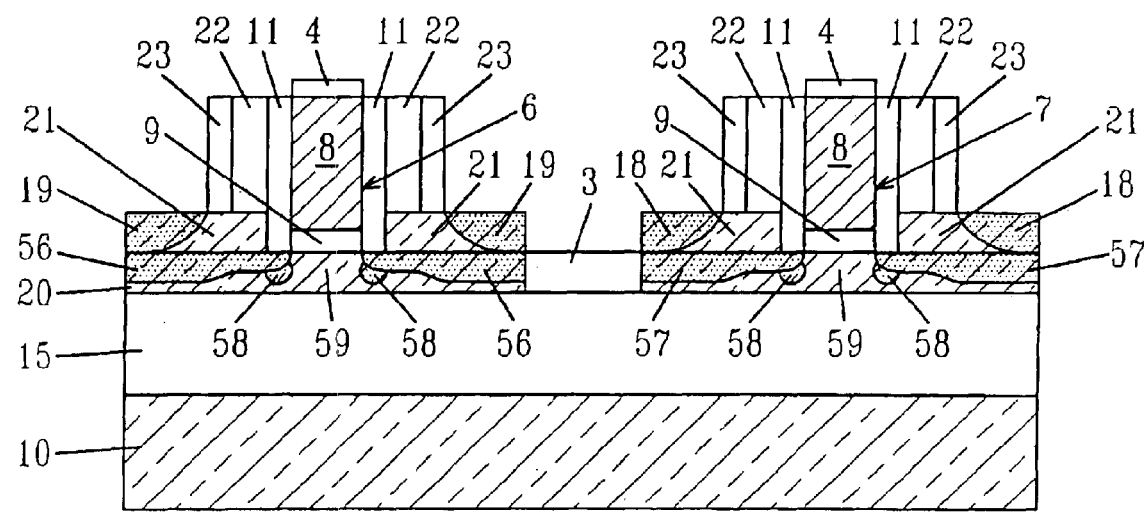
FIG. 7 is a pictorial representation (through a cross sectional view) of the structure shown in FIG. 6, further including the NFET diffusion region and PFET diffusion region.

The second dopant impurity regions 18 and first dopant impurity regions 19 are then activated using an activation anneal process, such as rapid thermal anneal. The activation anneal utilizes an anneal temperature of about 750° C. to about 1100° C. for a time period of about 1 second to about 20 seconds. The anneal process causes the first dopant impurity, implanted in first dopant impurity region 19, and second dopant impurity, implanted in second dopant impurity region 18, to diffuse into the SOI layer 20 and form first diffusion region 56 and second diffusion region 57, as depicted in FIG. 7.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A thin channel silicon-on-insulator device comprising:
   a substrate having a layer of semiconducting material atop an insulating layer;
   a gate region atop said layer of semiconducting material;
   a set of thin spacers abutting said gate region having a first spacer width;
   a raised source/drain region on either side of said channel and atop said layer of semiconducting material, wherein said raised source/drain region are separated from said gate region by said set of thin spacers; and
   a set of offset spacers having a offset spacer width atop said raised source/drain region and adjacent said set of thin spacers, wherein said offset spacer width is greater than said thin spacer width.

2. The thin channel silicon-on-insulator device of claim 1 wherein said thin spacer width ranges from about 3.0 nm to about 15.0 nm.

3. The thin channel silicon-on-insulator device of claim 1 further comprising extension regions underlying said thin spacer.

4. The thin silicon-on-insulator device of claim 3 further comprising halo regions located underneath and laterally adjacent to said extension regions.

* * * * *